United States Patent
Marumo (10) Patent No.: US 7,198,662 B2
(45) Date of Patent: Apr. 3, 2007

(54) ELECTROLESS PLATING PRE-TREATMENT SOLUTION AND ELECTROLES PLATING METHOD

(75) Inventor: Yoshinori Marumo, Chino (JP)

(73) Assignee: Tokyo Electron Limited, Tokyo (JP)

( * ) Notice: Subject to any disclaimer, the term of this patent is extended or adjusted under 35 U.S.C. 154(b) by 26 days.

(21) Appl. No.: 10/882,340

(22) Filed: Jul. 2, 2004

(65) Prior Publication Data

US 2005/0013928 A1  Jan. 20, 2005

(30) Foreign Application Priority Data

Jul. 15, 2003 (JP) ............................. 2003-275023

(51) Int. Cl.
  C23C 18/30 (2006.01)
  B05D 3/10 (2006.01)
(52) U.S. Cl. ................... 106/1.05; 106/1.11; 427/99.5; 427/304
(58) Field of Classification Search ............... 106/1.05, 106/1.11; 427/99.5, 304
  See application file for complete search history.

(56) References Cited

U.S. PATENT DOCUMENTS 4,154,877 A * 5/1979 Vratny ........................ 427/328

2004/0043153 A1 * 3/2004 Okuhama et al. ........... 427/307
2004/0202958 A1 * 10/2004 Kataoka et al. .......... 430/270.1

FOREIGN PATENT DOCUMENTS

| EP | 1152071 | * 11/2001 |
|---|---|---|
| EP | 1281787 | * 2/2003 |
| JP | 9-78251 | 3/1997 |
| JP | 2000-219994 | 8/2000 |
| JP | 2002-69656 | 3/2002 |
| JP | 2002-151518 | 5/2002 |
| JP | 2002-249891 | 9/2002 |
| JP | 2003-62468 | 3/2003 |

* cited by examiner

*Primary Examiner*—Helene Klemanski
(74) *Attorney, Agent, or Firm*—Oblon, Spivak, McClelland, Maier & Neustadt, P.C.

(57) ABSTRACT

It is an object of the present invention to provide an electroless plating pre-treatment solution and an electroless plating method capable of shortening the incubation time and achieving cost reduction.

As the pre-treatment solution 7 to be supplied onto the wafer W before the electroless plating, an aqueous solution is supplied in which an activation accelerator to accelrate the oxidative decomposition reaction of a reducing agent and an oxide layer remover to remove an oxide layer formed on the wiring portions 4a are dissolved. The activation accelerator includes at least one selected from the group consisting of sulfonic acid having two or more characteristic groups, derivatives of the sulfonic, and salts of the sulfonic acid.

16 Claims, 5 Drawing Sheets

3-[(AMINO-IMINOMETHYL)-THIO]
-1-PROPANESULFONIC ACID

2-AMINOETHANESULFONIC ACID

BIS(3-SULFOPROPYL)
SODIUM DISULFIDE 3-(2-BENZTHIAZOLYLTHIO)
-1-PROPANESULFONIC ACID SODIUM SALT

3-MERCAPTOPROPANESULFONIC
ACID SODIUM SALT

ELECTROLESS PLATING PRE-TREATMENT SOLUTION AND ELECTROLES PLATING METHOD

CROSS-REFERENCE TO THE INVENTION

This application is based upon and claims the benefit of priority from the prior Japanese Patent Application No. 2003-275023, filed on Jul. 15, 2003; the entire contents of which are incorporated herein by reference.

BACKGROUND OF THE INVENTION

1. Filed of the Invention

The present invention relates to an electroless plating pre-treatment solution used in pre-treatment of electroless plating and an electroless plating method using this electroless plating pre-treatment solution.

2. Description of the Related Art

In order to achieve higher integration density and higher function of a semiconductor device, there has arisen a demand for the improvement in the operation speed of the device in recent years. In accordance with this demand, wiring for element connection has become finer and multi-leveled. In order to respond to the finer wiring structure and more multilevel interconnection, Cu is currently used as a wiring material and a damascene method is adopted. This method is a method of forming the wiring by forming a wiring film on the surface of an interlayer insulation film having wiring grooves, and thereafter removing the wiring film, leaving only portions thereof in the wiring grooves.

In order to realize the finer wiring structure, research and technical development are underway to realize a lower dielectric constant interlayer insulation film and improve electromigration (EM) resistance of Cu. As a technique of improving the EM resistance, a cap metal technique is known. This technique is to selectively form, on Cu wiring, different metal by an electroless plating method to improve adhesiveness of the interface. Incidentally, when a cap metal film is imparted a diffusion preventive property to Cu, an etch stopper film can also have a lower dielectric constant, so that it is possible to lower an effective dielectric constant.

Electroless plating currently adopted for forming a cap metal film uses dimethylamine borane (DMAB), hydrophosphite, or the like as a reducing agent (see, for example, Japanese Patent Application Laid-open No. 2002-151518). Here, if dymethylamine borane is used as the reducing agent, it is possible to apply plating on the Cu wiring without any help by a precious metal catalyst such as Pd since Cu has catalytic activity to an oxidative decomposition reaction of dimethylamine borane. On the other hand, if hydrophosphite is used as the reducing agent, a precious metal catalyst such as Pd is added in applying plating on the Cu wiring since Cu does not have catalytic activity to hydrophosphite.

However, the surface of the Cu wiring becomes inactive due to the adhesion of an antioxidant or the like and surface oxidation that are caused by chemical mechanical polishing (CMP) and a cleaning process. Therefore, cleaning and activating processes are required. Especially in the use of dimethylamine borane as the reducing agent, the time from the start of the supply of an electroless plating solution to the start of a plating reaction (hereinafter, referred to as "incubation time") is long and unstable, so that forming the cap metal film on the Cu wiring requires difficult time management and is time-consuming. Further, in the use of hydrophosphite as the reducing agent, precious metal with a strong catalytic force such as Pd is used for surface substitution, which results in cost increase, though shortening the incubation time.

BRIEF SUMMARY OF THE INVENTION

The present invention was made in order to solve the problems stated above. Therefore, it is an object of the present invention to provide an electroless plating pre-treatment solution and an electroless plating method capable of shortening the incubation time and achieving cost reduction.

An electroless plating pre-treatment solution according to one of the aspects of the present invention is an aqueous solution in which at least one selected from the group consisting of sulfonic acid having two or more characteristic groups, derivatives of the sulfonic, and salts of the sulfonic acid is included. According to the electroless plating pre-treatment solution of the aspect of the present invention, it is possible to shorten the incubation time and achieve cost reduction. Specifically, the sulfonic acid having two or more characteristic groups, and the derivatives and the salts thereof are thought to have a function of lowering activation energy of an oxidative decomposition reaction in electroless plating. Accordingly, the oxidative decomposition reaction is accelerated, and it is thought that the incubation time can be shortened. Further, from the cost comparison of the use of at least one of the sulfonic acid having two or more characteristic groups, and the derivatives and the salts thereof with the use of a precious metal catalyst, it is found out that the cost required when at least one of the sulfonic acid having two or more characteristic groups, and the derivatives and the salts thereof is used is only about $\frac{1}{100}$ to about $\frac{1}{300}$ of the cost required when the precious metal catalyst is used. Therefore, cost reduction can be realized.

Preferably, at least one of the characteristic groups is at least one selected from the group consisting of an amino group and an imino group. The use of such substance can further shorten the incubation time. Specifically, metal ions dissolved in an electroless plating solution coordinate to an unshared electron pair of N of the amino group or the imino group. A similar action is obtainable in sulfonic acid having a cation derivative of N, derivatives and salts thereof. This can increase the concentration of the metal ions in the vicinity of a surface to be plated, resulting in enhanced reactivity. Therefore, the incubation time can be further shortened.

Preferably, at least one selected from the group consisting of the sulfonic acid, the derivatives of the sulfonic acid, and the salts of the sulfonic acid is at least one selected from the group consisting of 3-[(amino-iminomethyl)-thio]-1-propanesulfonic acid, 2-aminoethanesulfonic acid, bis(3-sulfopropyl)disulfide, 3-(2-benzthiazolylthio)-1-propanesulfonic acid, 3-mercaptopropanesulfonic acid, derivatives of the above-listed sulfonic acids, and salts of the above-listed sulfonic acids. The use of such substance can surely shorten the incubation time.

Preferably, the pre-treatment solution being the aqueous solution further includes at least one selected from the group consisting of inorganic acid, salts of the inorganic acid, organic acid other than sulfonic acid, and salts of the organic acid. The dissolution of such substance in the aqueous solution makes it possible to remove an oxide layer and a surface adsorbate that are formed on the surface to be plated.

Preferably, the inorganic acid is at least one selected from the group consisting of hydrochloric acid and sulfuric acid. With the use of such substance as the inorganic acid, the activation of the metal ions included in the electroless plating solution does not easily lower, which can further shorten the incubation time.

An electroless plating method according to another aspect of the present invention comprises: supplying, to a substrate having a metal portion in at least part of a surface, an electroless plating pre-treatment solution that is an aqueous solution in which at least one selected from the group consisting of sulfonic acid having two or more characteristic groups, derivatives of the sulfonic, and salts of the sulfonic acid is included; and supplying an electroless plating solution to the substrate to which the electroless plating pre-treatment solution has been supplied. According to the electroless plating method of the aspect of the present invention, it is possible to shorten the incubation time and realize cost reduction.

Preferably, at least one of the characteristic groups is at least one selected from the group consisting of an amino group and an imino group. The use of such substance can further shorten the incubation time.

Preferably, at least one selected from the group consisting of the sulfonic acid, the derivatives of the sulfonic acid, and the salts of the sulfonic acid is at least one selected from the group consisting of 3-[(amino-iminomethyl)-thio]-1-propanesulfonic acid, 2-aminoethanesulfonic acid, bis(3-sulfopropyl)disulfide, 3-(2-benzthiazolylthio)-1-propanesulfonic acid, 3-mercaptopropanesulfonic acid, derivatives of the above-listed sulfonic acids, and salts of the above-listed sulfonic acids. The use of such substance can surely shorten the incubation time.

Preferably, the metal portion is made of a first metal, and metallic salt of a second metal different from the first metal is included in the electroless plating solution. The adoption of such composition makes it possible to form a film of the second metal different from the first metal on the metal portion.

The first metal may be a metal selected from the group consisting of copper (Cu), cobalt (Co), nickel (Ni), ruthenium (Ru), palladium (Pd), silver (Ag), iridium (Ir), and alloys thereof. Further, the second metal may be a metal selected from the group consisting of cobalt (Co), nickel (Ni), copper (Cu), ruthenium (Ru), silver (Ag), and alloys thereof.

The substrate may have an interlayer insulation film in which at least one of a recession and an opening is formed, and the metal portion is buried in at least one of the recession and the opening.

DETAILED DESCRIPTION OF THE INVENTION

Figure 1:
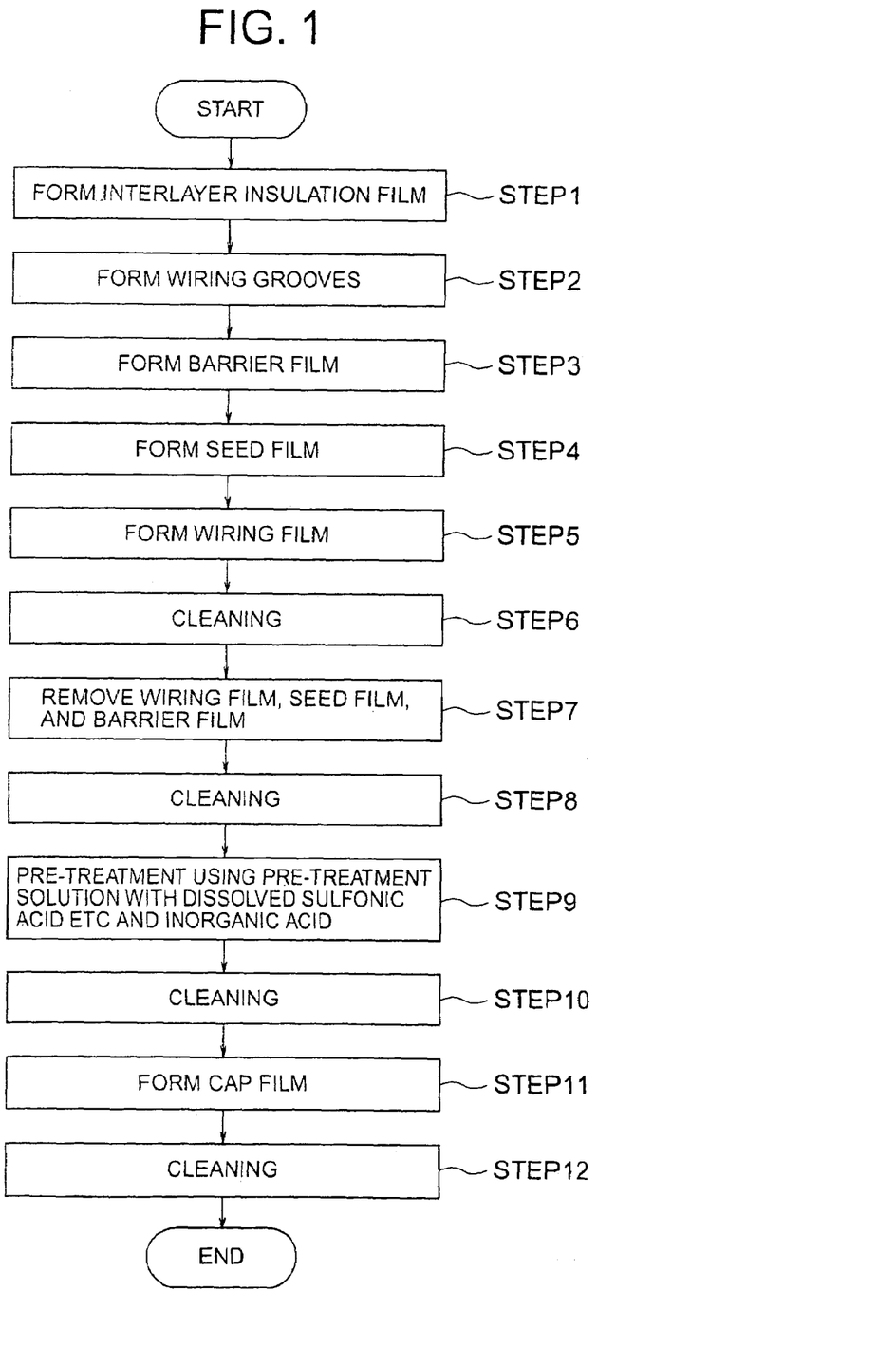
FIG. 1 is a flowchart showing the flow of a series of processes according to an embodiment.
Figure 2A:
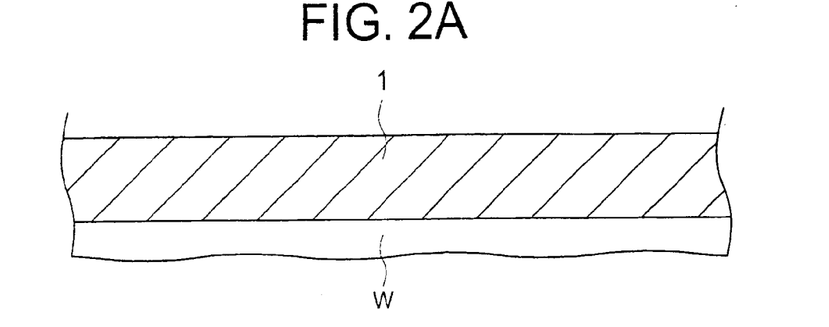
FIG. 2A to FIG. 2L are schematic views of the respective processes according to the embodiment.

FIG. 1 is a flowchart showing the flow of a series of processes according to this embodiment, and FIG. 2A to FIG. 2L are schematic views of the respective processes according to this embodiment. As shown in FIG. 1 and FIG. 2A, an interlayer insulation film 1 is formed by, for example, chemical vapor deposition (CVD) on a semiconductor wafer W (hereinafter, simply referred to as a "wafer") on which semiconductor elements (not shown) such as transistors are formed (Step 1). The interlayer insulation film 1 is made of, for example, a low dielectric constant insulator. For example, SiOF, SiOC, porous silica, or the like is usable as such a low dielectric constant insulator.

Figure 2B:
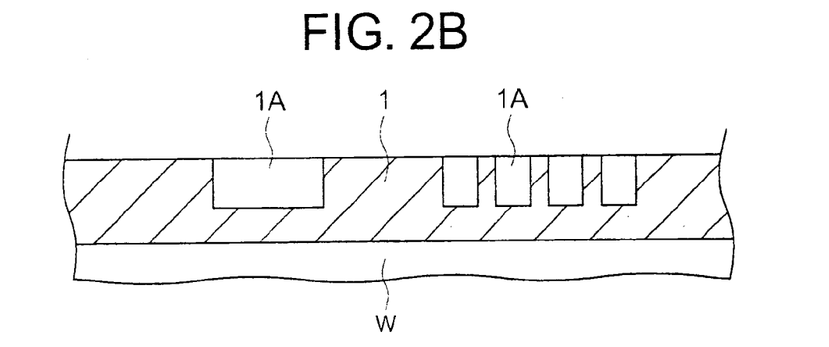

After the interlayer insulation film 1 is formed on the wafer W, wiring grooves 1A are formed in the interlayer insulation film 1 by photolithography, as shown in FIG. 2B (Step 2). Specifically, the interlayer insulation film 1 is first coated with a chemically amplified photoresist while the wafer W is being rotated. After the coating of the photoresist, the photoresist is exposed to an ultraviolet ray such as an i-ray or a far ultraviolet ray such as KrF, using a mask having a predetermined pattern formed therein. Thereafter, it is developed with a developing solution, so that a resist pattern is formed on the interlayer insulation film 1. After the resist pattern is formed on the interlayer insulation film 1, the interlayer insulation film 1 is dry-etched by CF-based gas such as $CF_4$ or $CHF_3$, with the resist pattern used as a mask, so that the wiring grooves 1A are formed in the interlayer insulation film 1. Finally, after the wiring grooves 1A are formed in the interlayer insulation film 1, the resist pattern is removed by ashing. Incidentally, instead of or in addition to the wiring grooves 1A, connection holes may be formed.

Figure 2C:
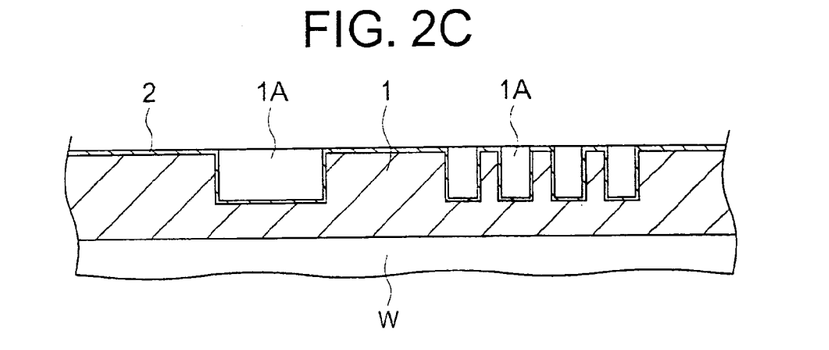

After the wiring grooves 1A are formed in the interlayer insulation film 1, a barrier metal film 2 for inhibiting metal diffusion to the interlayer insulation film 1 is formed on the interlayer insulation: film 1 by, for example, sputtering or CVD, as shown in FIG. 2C (Step 3). The barrier metal film 2 is made of a conductive material. Such a conductive material is composed of metal, metal nitride, or the like having a smaller diffusion coefficient than that of metal forming later-described wiring portions 4A. For example, Ta or the like is usable as such metal. Further, for example, TiN, TaN, WN, or the like is usable as the metal nitride.

Figure 2D:
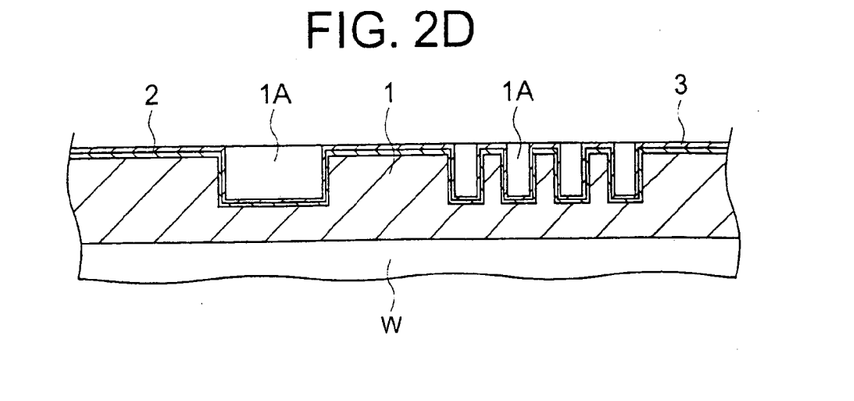

After the barrier metal film 2 is formed on the interlayer insulation film 1 to be about 30 nm, a seed film 3 for electric current passage at the time of electrolytic plating is formed on the barrier metal 2 by, for example, sputtering, as shown in FIG. 2D (Step 4). The seed film 3 is made of, for example, pure metal or an alloy. For example, at least one of Cu, Co, Ni, Ru, Pd, Ag, and Ir is usable as such pure metal, and as the alloy, an alloy containing at least one of these metals is usable.

Figure 2E:
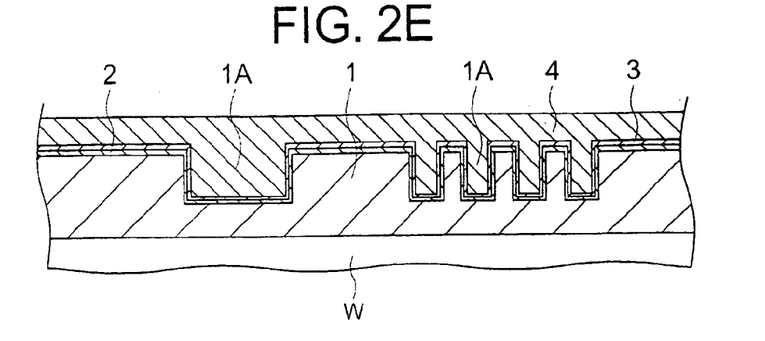

After the seed film 3 is formed on the barrier metal film 2 to be about 100 nm, a wiring film 4 is formed on the seed film 3 by, for example, electrolytic plating as shown in FIG. 2E (Step 5). Here, since the seed film 3 is also formed inside the wiring grooves 1A, the wiring film 4 is also formed inside the wiring grooves 1A. The wiring film 4 is made of metal (first metal). For example, pure metal or an alloy is usable as the metal. As such pure metal, for example, at least one of Cu, Co, Ni, Ru, Pd, Ag, and Ir is usable, and as the alloy, an alloy containing at least one of these metals is usable.

Figure 2F:
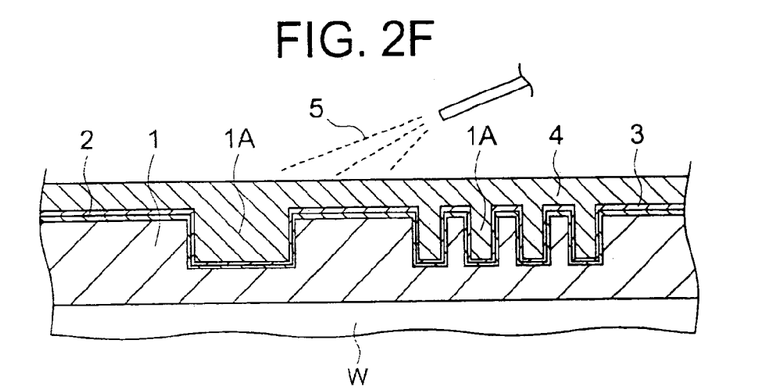

After the wiring film 4 is formed on the seed film 3 to be about 0.5 μm to about 1 μm, a cleaning liquid 5, for example, pure water, is supplied on the wiring film 4 to clean the wafer W, as shown in FIG. 2F (Step 6).

Figure 2G:
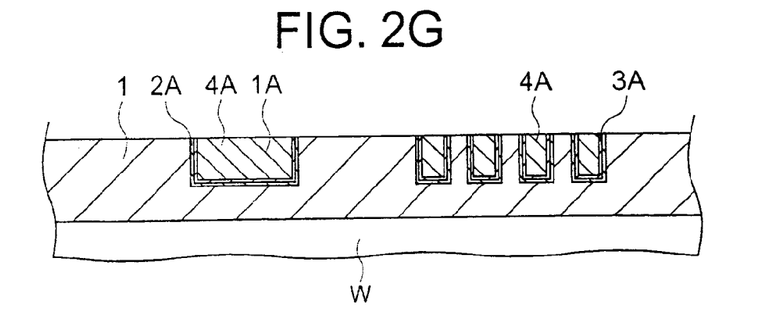

After the wafer W is cleaned, the wiring film 4, the seed film 3, and the barrier metal 2 on the interlayer insulation film 1 are polished by, for example, CMP to be removed, with only portions 4A (hereinafter, referred to as "wiring portions") of the wiring film 4, portions 3A of the seed film 3, and portions 2A of the barrier metal film 2 that exist inside the wiring grooves 1A being left, as shown in FIG. 2G (Step 7). Specifically, while the wafer W is in contact with a polishing pad (not shown), the wafer. W and the polishing pad are rotated and at the same time, a slurry (not shown) is supplied on the wafer W, thereby polishing the wiring film 4, the seed film 3, and the barrier metal film 2. Incidentally, the polishing method is not limited to CMP, but may be other methods. As the other methods, for example, electrolytic polishing is usable.

Figure 2H:
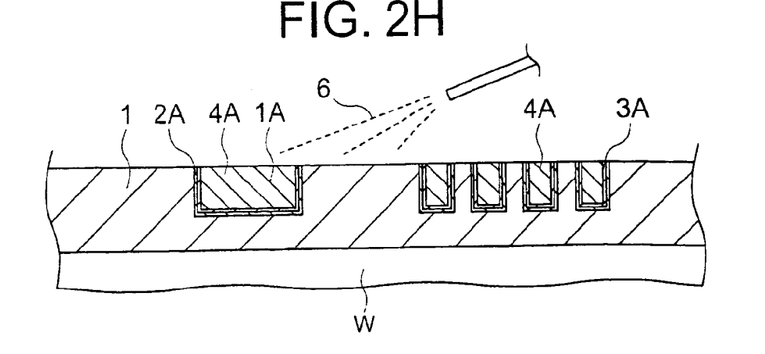

After the wiring film 4, the seed film 3, and the barrier metal film 2 are removed by CMP, a cleaning liquid 6 is supplied to the wafer W to clean the wafer W as shown in FIG. 2H (Step 8). This cleaning removes metal, particles, etc. such as Cu and CMP slurry from the wafer W.

Figure 2I:
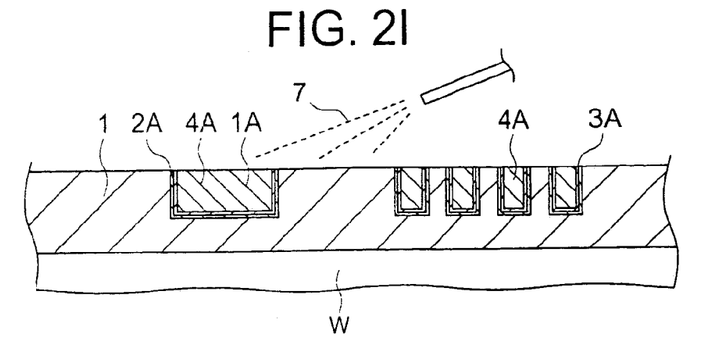

After the wafer W is cleaned, a pre-treatment solution 7 is supplied to the wafer W to pre-treat the wafer W as shown in FIG. 2I (Step 9). The pre-treatment solution 7 is an aqueous solution in which an activation accelerator and an oxide layer remover are dissolved. The activation accelerator is intended for accelerating an oxidative decomposition reaction of a later-described reducing agent. The oxide layer remover is intended for removing an oxide layer formed on the surfaces of the wiring portions 4A and a surface adsorbate adsorbed on the surfaces of the wiring portions 4A. The pre-treatment solution 7 is preferably used at room temperature but may be heated.

Figure 3:
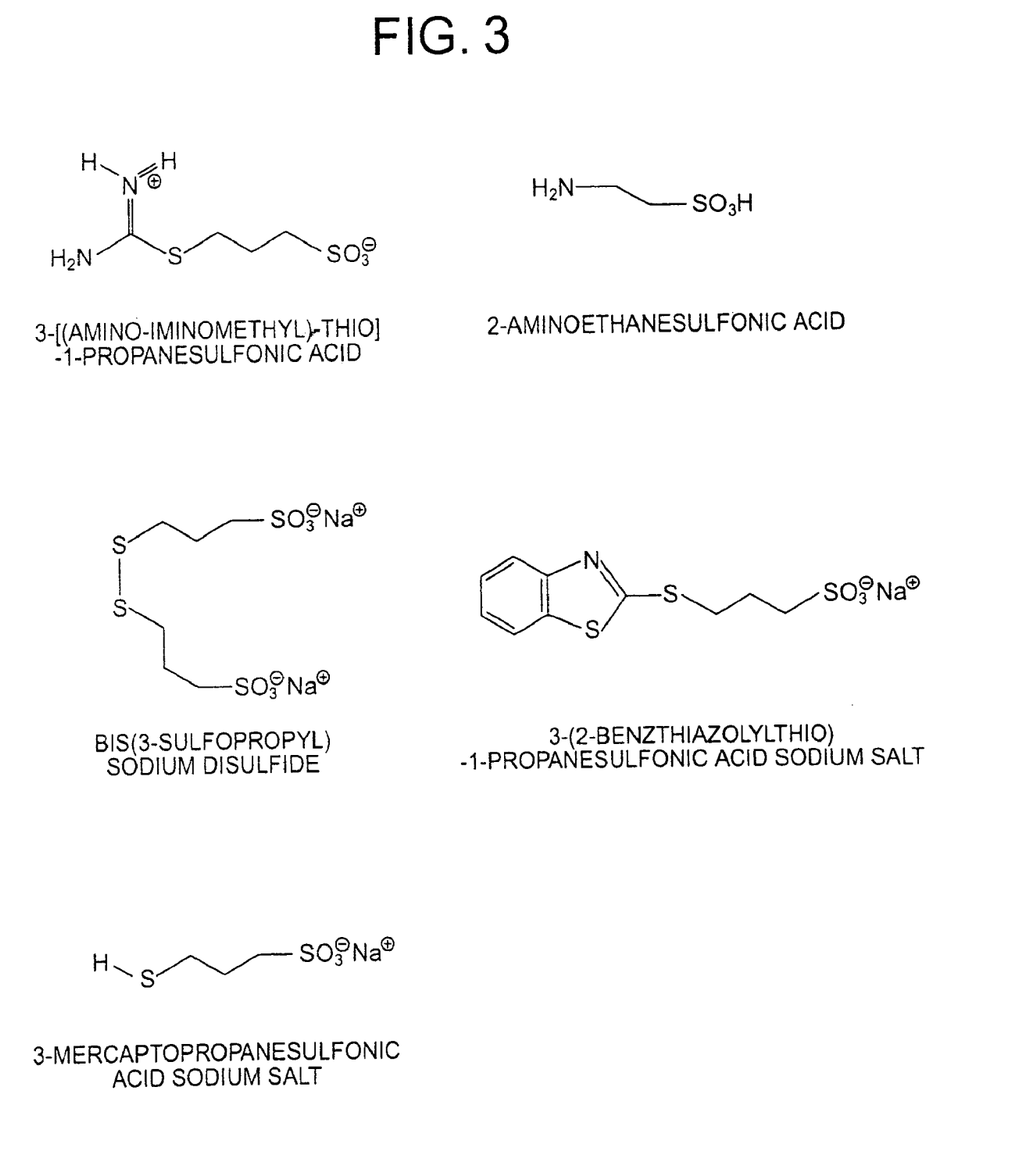
FIG. 3 is a chart illustrating structural formulas of sulfonic acids and sulfonates that are usable.

The activation accelerator is composed of at least one of sulfonic acid, sulfonic acid derivatives, and sulfonates (hereinafter, "at least one of sulfonic acid, sulfonic acid derivatives, and sulfonates" is sometimes called "sulfonic acid etc." for short). The sulfonic acid etc. has two or more characteristic groups. The "characteristic group" is a general name for a group directly bonded with a base structure by bonding other than C—C bonding (an atom other than hydrogen or an atomic group), —C≡N, >C═X (X═O, S, Se, Te, NH, NR), and so on. Examples of the sulfonic acid are 3-[(amino-iminomethyl)-thio]-1-propanesulfonic acid (UPS), 2-aminoethanesulfonic acid (taurine), bis(3-sulfopropyl)disulfide, 3-(2-benzthiazolylthio)-1-propanesulfonic acid, 3-mercaptopropanesulfonic acid, and the like. Examples of the sulfonates are salts of the sulfonic acids listed above, and the like. Specifically, usable is, for example, bis(3-sulfopropyl)sodium disulfide (SPS), 3-(2-benzthiazolylthio)-1-propanesulfonic acid sodium salt (ZPS), 3-mercaptopropanesulfonic acid sodium salt, or the like. See FIG. 5 for examples of the structural formulas of the usable sulfonic acids or the like.

When the activation accelerator is composed of only sulfonic acid, only a sulfonic acid derivative, or only sulfonate, the concentration of the sulfonic acid, sulfonic acid derivative, or sulfonate is preferably about 0.01 wt % to about 30 wt %, and more preferably, about 1.0 wt % to about 3.0 wt %. When the activation accelerator is a mixture of at least two or more of sulfonic acid, a sulfonic acid derivative, and sulfonate, the total concentration of the sulfonic acid, sulfonic acid derivative, and sulfonate is preferably about 0.01 wt % to about 30 wt %, and more preferably, about 1.0 wt % to about 3.0 wt %.

The characteristic group of the sulfonic acid etc. preferably contains at least one of an amino group and an imino group. More preferable are sulfonic acid etc. having both the amino group and the imino group, the sulfonic acid having a plurality of amino groups if the sulfonic acid etc. has the amino group but not the imino group, and the sulfonic acid having a plurality of imino groups if the sulfonic acid etc. has the imino group but not the amino group. In this embodiment, the description will be given on a case where the sulfonic acid etc. having both the amino group and the imino group is used as the activation accelerator.

As the oxide layer remover, for example, at least one of inorganic acid, organic acid other than sulfonic acid, salts thereof, and the like is usable. Examples of the inorganic acid are hydrohalogenic acid, sulfuric acid, and so on. Examples of the hydrohalogenic acid are hydrofluoric acid, hydrochloric acid, and so on. When hydrofluoric acid is used as the oxide layer remover, the concentration of the hydrofluoric acid is preferably about 3.0 vol % or lower (excluding zero). When hydrochloric acid is used as the oxide layer remover, the concentration of the hydrochloric acid is preferably about 10 ppm to about 1000 ppm, and more preferably, about 100 ppm to about 400 ppm.

Examples of the organic acid are carboxylic acid, ascorbic acid, and so on. Examples of the carboxylic acid are oxalic acid, malonic acid, succinic acid, maleic acid, DL-malic acid, tartaric acid, glyoxylic acid, citric acid, and so on. The concentration of the organic acid is preferably about 0.1 vol % to about 20 vol %, and more preferably, about 0.5 vol % to about 3.0 vol % in light of the oxide layer removing performance. In this embodiment, the description will be given on a case where inorganic acid is used as the oxide layer remover.

When the pre-treatment solution 7 is supplied to the wafer W, the oxide layer formed on the surfaces of the wiring portions 4A and the surface adsorbate adsorbed on the surfaces of the wiring portions 4A are removed by the inorganic acid dissolved in the pre-treatment solution 7. Further, the sulfonic acid etc. dissolved in the pre-treatment solution 7 is adsorbed on the surfaces of the wiring portions 4A from which the oxide layer and the surface adsorbate have been removed. Note that the sulfonic acid etc. is also adsorbed on the surface of the interlayer insulation film 1.

Figure 2J:
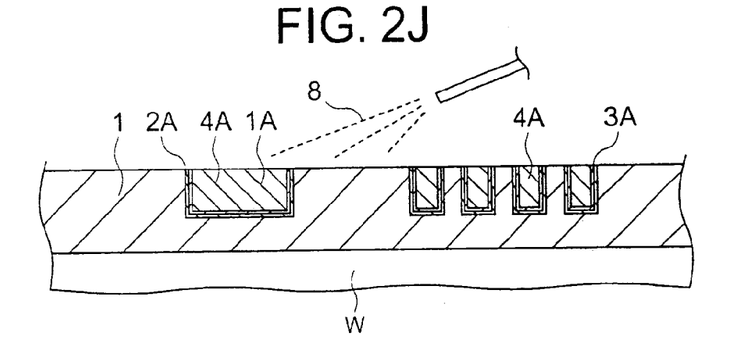

After the pre-treatment solution 7 is supplied to the wafer W, pure water 8 is supplied to the wafer W to clean the wafer W as shown in FIG. 2J (Step 10). This cleaning removes the excessive sulfonic acid etc. from the wafer W.

Figure 2K:
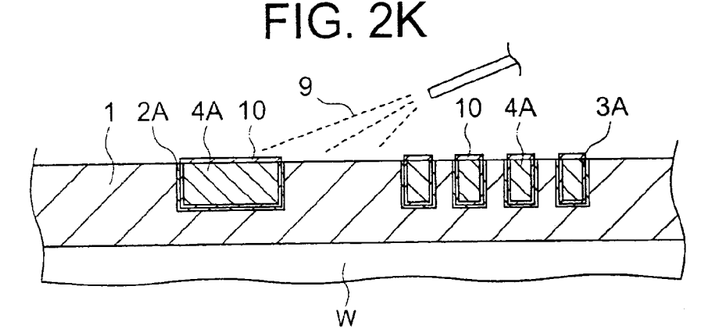

After the wafer W is cleaned, an electroless plating solution 9 is supplied to the wafer W, so that a cap metal film 10 for inhibiting the diffusion of metal composing the wiring portions 4A in the interlayer insulation film 1 is formed by electroless plating, as shown in FIG. 2K (Step 11). Note that the cap metal film 10 also has a function of inhibiting oxidation of the metal composing the wiring portions 4A.

The electroless plating solution 9 is an aqueous solution in which metallic salt, a reducing agent, a complexing agent, a pH adjusting agent, and so on are dissolved as major components. The metallic salt supplies metal ions. As the metallic salt, for example, metal sulfide, metal chloride, or the like is usable. Further, as metal (second metal) composing the metallic salt, at least one of Co, Ni, Cu, Ru, Ag, and so on is usable.

The reducing agent reduces the metal ions. The reducing agent used here has catalytic activity to the metal composing the wiring portions 4A and metal to be reduced/precipitated. Specifically, when the metal composing the wiring portions 4A is Cu and the metal to be precipitated contains Co or Ni, for example, boride is used as the reducing agent. Examples of the boride are dimethylamine borane (DMAB), diethylamine borane, morpholine borane, pyridineamine borane, piperidine borane, ethylenediamine borane, ethylenediamine bisborane, t-buthylamineborane, imidazole borane, methoxyethylamine borane, sodium borohydride, and so on.

The complexing agent complexes the metal ions so as to prevent the metal ions from being deposited as hydroxide, thereby improving stability in the electroless plating solution. As the complexing agent, usable are, for example, ammonia, ethylenediamine, citric acid, trisodiumcitrate, acetic acid, DL-malic acid, glycine, ethylenediaminetetraacetic acid (EDTA), and so on.

The pH adjusting agent adjusts pH of the electroless plating solution. As the pH adjusting agent, usable are, for example, tetramethylammoniumhydroxide (TMAH), potassiumhydroxide, and so on. See Table 1 for specific compositions and so on of the electroless plating solution 9.

TABLE 1

|  | Electroless Plating Solution 1 | Electroless Plating Solution 2 |
|---|---|---|
| Metallic Salt | Nickel Sulfate 0.1 mol/L | Nickel Sulfate 0.02 mol/L |
| Metallic Salt | — | — |
| Reducing Agent | DMAB 0.025 mol/L | DMAB 0.02 mol/L |
| Complexing Agent | Citric Acid 0.1 mol/L | DL-Malic acid, Glycine |
| pH Adjusting Agent | TMAH | Ammonia Water |
| pH | 9 | 5 to 12 |
| Temperature | 50 to 60° C. | 60° C. |
| Precipitated Metal | Ni—B | Ni—B |

|  | Electroless Plating Solution 3 | Electroless Plating Solution 4 |
|---|---|---|
| Metallic Salt | Nickel Sulfate 0.1 mol/L | Cobalt Sulfate 0.1 mol/L |
| Metallic Salt | Ammonium Tungstate 0.005 mol/L | — |
| Reducing Agent | DMAB 0.025 mol/L | DMAB 0.025 mol/L |
| Complexing Agent | Citric Acid 0.1 mol/L | Citric Acid 0.1 mol/L |
| pH Adjusting Agent | TMAH | TMAH |
| pH | 10 | 8.5 |
| Temperature | 50° C. | 50 to 60° C. |
| Precipitated Metal | Ni—W—B | Co—B |

|  | Electroless Plating Solution 5 | Electroless Plating Solution 6 |
|---|---|---|
| Metallic Salt | Cobalt Chloride 0.1 mol/L | Cobalt Sulfate 0.1 mol/L |
| Metallic Salt | Sodium Tungstate 0.03 mol/L | Ammonium Tungstate 0.03 mol/L |
| Reducing Agent | DMAB | DMAB 0.06 mol/L |
| Complexing Agent | Trisodium Citrate 0.3 mol/L | Citric Acid 0.2 mol/L |
| pH Adjusting Agent | KOH | TMAH |
| pH | 9.5 | 9.5 |
| Temperature | 75° C. | 60° C. |
| Precipitated Metal | Co—W—B | Co—W—B |

The cap metal film 10 is made of metal having a smaller diffusion coefficient than that of the metal composing the wiring portions 4. The metal may be pure metal or an alloy. As the pure metal, usable is, for example, at least one of Co, Ni, Cu, Ru, and Ag. As the alloy, usable is, for example, an alloy containing at least one of these metals. Specific examples of the alloy usable are Ni—B, Ni—W—B, Co—B, Co—W—B, and so on. Here, when dimethylamine borane (DMAB) is used as the reducing agent, Ni—B and Co—B are precipitated by, for example, chemical reactions as follows.

(1) Ni—B (i)

(ii)

(2) Co—B (i)

(ii)

Figure 2L:
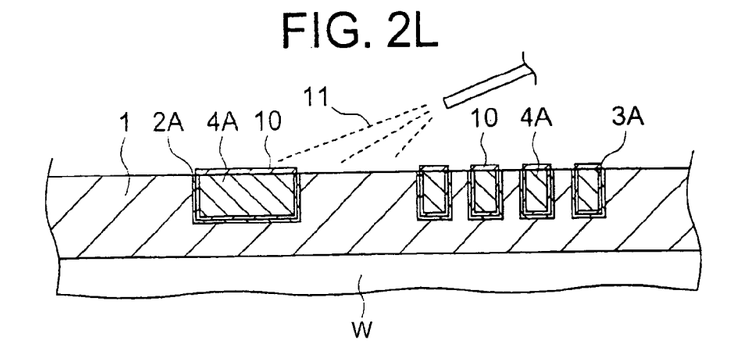

After the cap metal film 10 is formed on the wiring portions 4A to be several tens nm, pure water 11 is supplied to the wafer W to clean the wafer W as shown in FIG. 2L (Step 12). Consequently, the processes of this embodiment are completed.

In this embodiment, the use of the sulfonic acid etc. as the activation accelerator can shorten the incubation time. To be more specific, the sulfonic acid etc. is thought to have a function of lowering activation energy in the oxidative decomposition reaction of the reducing agent. Consequently, the oxidative decomposition reaction is accelerated. It is thought that the incubation time is as a result shortened.

In this embodiment, the use of the sulfonic acid etc. as the activation accelerator can realize cost reduction. To be more specific, from the cost comparison of the use of the sulfonic acid etc. with the use of a precious metal catalyst such as Pd, it is found out that the cost required in the case where the sulfonic acid etc. is used is only about 1/100 to about 1/300 of the cost required in the case where the precious metal catalyst is used. Therefore, cost reduction is realized.

In this embodiment, the use of the sulfonic acid etc. as the activation accelerator allows the selective formation of the cap metal film 10. To be more specific, if a catalyst is used as the activation accelerator, plating is sometimes applied not only on the wiring portions 4A but also on the interlayer insulation film 1. This is because the catalyst has catalytic activity to the reducing agent. On the other hand, the sulfonic acid etc. does not have catalytic activity to the reducing agent unlike the catalyst. Accordingly, even in the state where the sulfonic acid etc. is adsorbed on the surface of the interlayer insulation film 1, plating is not applied on the interlayer insulation film 1, but is applied only on the wiring portions 4A. Consequently, the cap metal film 10 is formed only on the wiring portions A. Therefore, the cap metal film 10 is selectively formed.

In this embodiment, the use of the sulfonic acid etc. as the activation accelerator can inhibit the increase in wiring resistance. To be more specific, if a metal catalyst such as Pd is used as the activation accelerator, the metal catalyst is taken into the cap metal film 10. This may possibly increase the wiring resistance. On the other hand, in this embodiment, since the sulfonic acid etc. is used as the activation accelerator, no influence is given to the wiring resistance even when the sulfonic acid etc. is taken into the cap metal film 10. Therefore, the increase in wiring resistance can be inhibited.

In this embodiment, since the sulfonic acid etc. having both the amino group and the imino group as the characteristic groups is used as the activation accelerator, the incubation time can be further shortened. To be more specific, when the electroless plating solution is supplied while the sulfonic acid etc. having the amino group and the imino group as the characteristic groups is adsorbed on the surfaces of the wiring portions 4A, the complexed metal ions coordinate to the unshared electron pair of N of the amino group and the imino group. Incidentally, the similar action is also obtained in sulfonic acid etc. having a cation derivative of N. This increases the concentration of the metal ions in the vicinity of the surfaces of the wiring portions 4A to enhance the reaction rate. Therefore, the incubation time can be further reduced.

In this embodiment, the use of the inorganic acid as the oxide layer remover can shorten the incubation time compared with a case where organic acid other than sulfonic acid is dissolved. To be more specific, when the inorganic acid is used as the oxide layer remover, the activity of the complexed metal ions is not easily lowered. Therefore, the incubation time can be shortened compared with the case where organic acid other than sulfonic acid is used.

EXAMPLE 1

Hereinafter, an example according to the present invention will be described. In this example, a plurality of pre-treatment solutions were prepared, and the incubation time was measured when each of the pre-treatment solutions was used.

Samples used in this example will be described below. In this example, pre-treatment solutions 1 to 18 were prepared. For the comparison with the pre-treatment solutions 1 to 18, pre-treatment solutions 19 to 33 were further prepared as a comparative example.

Activation accelerators used in this example were: 3-[(amino-iminomethyl)-thio]-1-propanesulfonic acid (USP) in the pre-treatment solutions 1 to 15; 2-aminoethanesulfonic acid (taurine) in the pre-treatment solution 16; bis(3-sulfopropyl)sodium disulfide (SPS) in the pre-treatment solution 17; and 3-(2-benzthiazolylthio)-1-propanesulfonic acid sodium salt (ZPS) in the pre-treatment solution 18. Activation accelerators used in the comparative example were: thiourea in the pre-treatment solution 30; 2-mercaptobenzothiazole (2-MBT) in the pre-treatment solution 31; and palladium chloride in the pre-treatment solutions 32, 33. No activation accelerator was used in the pre-treatment solutions 19 to 29. See Table 2 for detailed compositions of the pre-treatment solutions 1 to 33. As CMP-M01, CMP-M02, and $NH_4F$ in Table 2, those manufactured by Kanto Kagaku were used.

In these example and comparative example, the electroless plating solution 1 shown in Table 1 was used. Using the above-mentioned pre-treatment solutions and electroless plating solution, the pre-treatment solutions 1 to 33 were supplied to wiring portions composing Cu, and thereafter, the electroless plating solution was supplied thereto, thereby applying Ni—B plating.

The measurement results will be discussed below. As shown in Table 2, it has been almost confirmed that the incubation time is shorter when the pre-treatment solutions 1 to 18 are used as the pre-treatment solution than the incubation time when the pre-treatment solutions 19 to 31 are used. It has been further confirmed that the incubation time when the pre-treatment solutions 6, 7 are used is substantially the same as the incubation time when the pre-treatment solutions 32, 33 are used. From these results, it has been confirmed that the use of the pre-treatment solution in which the sulfonic acid etc. is dissolved can shorten the incubation time. It has been also confirmed that the use of the pre-treatment solution in which hydrochloric acid and sulfuric acid are dissolved in addition to the sulfonic acid etc. can further shorten the incubation time.

EXAMPLE 2

Hereinafter, another example according to the present invention will be described. In this example, a plurality of pre-treatment solutions were prepared, and the incubation time was measured when each of the pre-treatment solutions was used.

TABLE 2

| | | Activation Accelerator | Concentration | Oxide layer remover | Concentration | Incubation time(sec.) |
|---|---|---|---|---|---|---|
| EXAMPLE | PTS1 | UPS | 0.01 wt % | — | — | 109 |
| | PTS2 | UPS | 0.1 wt % | — | — | 51 |
| | PTS3 | UPS | 0.3 wt % | — | — | 30 |
| | PTS4 | UPS | 1.0 wt % | — | — | 12 |
| | PTS5 | UPS | 1.0 wt % | HF | 1.0 vol % | 74 |
| | PTS6 | UPS | 1.0 wt % | HCl | 400.0 ppm | 5 |
| | PTS7 | UPS | 1.0 wt % | $H_2SO_4$ | 5.0 wt % | 4 |
| | PTS8 | UPS | 1.0 wt % | Oxalic acid | 1.0 wt % | 41 |
| | PTS9 | UPS | 3.0 wt % | — | — | 12 |
| | PTS10 | UPS | 3.0 wt % | Oxalic acid | 1.0 wt % | 10 |
| | PTS11 | UPS | 3.0 wt % | Malonic acid | 1.0 wt % | 60 |
| | PTS12 | UPS | 3.0 wt % | Succinic acid | 1.0 wt % | 41 |
| | PTS13 | UPS | 3.0 wt % | DL-Malic acid | 1.0 wt % | 45 |
| | PTS14 | UPS | 3.0 wt % | Citric acid | 1.0 wt % | 40 |
| | PTS15 | UPS | 10.0 wt % | — | — | 18 |
| | PTS16 | Taurine | 1.0 wt % | — | — | 40 |
| | PTS17 | SPS | 1.0 wt % | — | — | 40 |
| | PTS18 | ZPS | 1.0 wt % | — | — | 53 |
| COMPARATIVE EXAMPLE | PTS19 | — | — | HF | 1.0 vol % | 180 |
| | PTS20 | — | — | HCl | 400.0 ppm | 164 |
| | PTS21 | — | — | $H_2SO_4$ | 5.0 wt % | 400 |
| | PTS22 | — | — | $NH_4F$ | 100.0 vol % | 199 |
| | PTS23 | — | — | CMP-M01 | 100.0 vol % | 500 |
| | PTS24 | — | — | CMP-M02 | 100.0 vol % | 220 |
| | PTS25 | — | — | Oxalic acid | 1.0 wt % | 190 |
| | PTS26 | — | — | Malonic acid | 1.0 wt % | 68 |
| | PTS27 | — | — | Succinic acid | 1.0 wt % | 71 |
| | PTS28 | — | — | DL-Malic acid | 1.0 wt % | 246 |
| | PTS29 | — | — | Citric acid | 1.0 wt % | 500 |
| | PTS30 | Thiourea | 1.0 wt % | — | — | NP |
| | PTS31 | 2-MBT | 1.0 wt % | — | — | NP |
| | PTS32 | $PdCl_2$ | — | — | — | 3 |
| | PTS33 | $PdCl_2$ | — | HF | 1.0 wt % | 3 |

PTS: Pre-treatment solution,
NP: No precipitation

Samples used in this example will be described below. Pre-treatment solutions 1 to 3 according to the example were prepared, and for the comparison with the pre-treatment solutions 1 to 3, pre-treatment solutions 4 to 7 according to a comparative example were prepared. As an activation accelerator in this example, 3-[(amino-iminomethyl)-thio]-1-propanesulfonic acid (USP) was used in the pre-treatment solutions 1 to 3. As an activation accelerator in the comparative example, palladium chloride was used in the pre-treatment solution 7. No activation accelerator was used in the pre-treatment solutions 4 to 6. See Table 3 for detailed compositions of the pre-treatment solutions 1 to 7.

TABLE 3

|   |      | Activation Accelerator | Concentration | Oxide layer remover | Concentration | Incubation time(sec.) |
|---|------|------------------------|---------------|---------------------|---------------|-----------------------|
| E | PTS1 | UPS                    | 1.0 wt %      | HCl                 | 400.0 ppm     | 7                     |
|   | PTS2 | UPS                    | 1.0 wt %      | $H_2SO_4$           | 5.0 wt %      | 4                     |
|   | PTS3 | UPS                    | 3.0 wt %      | Oxalic acid         | 1.0 wt %      | 9                     |
| CE| PTS4 | —                      | —             | —                   | —             | 247                   |
|   | PTS5 | —                      | —             | HF                  | 1.0 vol %     | 181                   |
|   | PTS6 | —                      | —             | HCl                 | 400.0 ppm     | 164                   |
|   | PTS7 | $PdCl_2$               | —             | HF                  | 1.0 vol %     | 1                     |

E: Example,
CE: Comparative Example,
PTS: Pre-treatment solution,

In these example and comparative example, the electroless plating solution 4 shown in Table 1 was used. Using the above-mentioned pre-treatment solutions and electroless plating solution, the pre-treatment solutions were supplied to wiring portions composing Cu, and thereafter, the electroless plating solution was supplied, thereby applying Co—B plating.

The measurement results will be discussed below. As shown in Table 3, it has been confirmed that the incubation time is shorter when the pre-treatment solutions 1 to 3 are used as the pre-treatment solution than the incubation time when the pre-treatment solutions 4 to 6 are used. It has been also confirmed that the incubation time when the pre-treatment solution 1 is used is substantially the same as the incubation time when the pre-treatment solution 7 is used. From these results, it has been confirmed that the use of the pre-treatment solution in which sulfonic acid etc. is dissolved shortens the incubation time. It has been also confirmed that the use of the pre-treatment solution in which hydrochloric acid and sulfuric acid are dissolved in addition to the sulfonic acid etc. shortens the incubation time.

It should be noted that the present invention is not limited to the described contents in the aforementioned embodiment, and the structure, the materials, the arrangement of respective members, and the like can be appropriately modified without departing from the spirit of the present invention. For example, though the pre-treatment solution 7 contains the oxide layer remover in the above embodiment, the pre-treatment solution 7 need not contain the oxide layer remover.

The wiring film 4 is formed by the electrolytic plating in the above-described embodiment, but the wiring film 4 may be formed by a different method. As the different method, for example, electroless plating, sputtering, CVD, or the like is available. Here, when the wiring film 4 is formed by the electroless plating, it can be formed by substantially the same method as the method for forming the cap metal film 10. Further, the wafer W is used for explanation in the above-described embodiment, a glass substrate may be used.

What is claimed is:

1. An electroless plating pre-treatment solution being an aqueous solution comprising at least an activation accelerator selected from the group consisting of sulfonic acid having two or more characteristic groups, derivatives of the sulfonic acid, and salts of the sulfonic acid, wherein said activation accelerator accelerates an oxidative decomposition reaction of a reducing agent in electroless plating without metal catalyst.

2. The electroless plating pre-treatment solution as set forth in claim 1, wherein at least one of the characteristic groups is at least one selected from the group consisting of an amino group and an imino group.

3. The electroless plating pre-treatment solution as set forth in claim 1, wherein said activation accelerator includes at least one selected from the group consisting of 3-[(amino-iminomethyl)-thio]-1-propanesulfonic acid, 2-aminoethanesulfonic acid, bis(3-sulfopropyl)disulfide, 3-(2-benzthiazolylthio)-1-propanesulfonic acid, 3-mercaptopropanesulfonic acid, derivatives of the above-listed sulfonic acids, and salts of the above-listed sulfonic acids.

4. The electroless plating pre-treatment solution as set forth in claim 1, further comprising at least one selected from the group consisting of an inorganic acid, a salt of said inorganic acid, an organic acid other than sulfonic acid, and a salt of said organic acid.

5. The electroless plating pre-treatment solution as set forth in claim 4, comprising at least one of hydrochloric acid and sulfuric acid.

6. An electroless plating method comprising:
supplying, to a substrate having a metal portion in at least part of a surface, the electroless plating pre-treatment solution according to claim 1; and
supplying an electroless plating solution to the substrate to which the electroless plating pre-treatment solution has been supplied.

7. The electroless plating method as set forth in claim 6, wherein at least one of the characteristic groups is at least one selected from the group consisting of an amino group and an imino group.

8. The electroless plating method as set forth in claim 6, wherein said at least one selected from the group consisting of the sulfonic acid, the derivatives of the sulfonic acid, and the salts of the sulfonic acid is at least one selected from the group consisting of 3-[(amino-iminomethyl)-thio]-1-propanesulfonic acid, 2-aminoethanesulfonic acid, bis(3-sulfopropyl)disulfide, 3-(2-benzthiazolylthio)-1-propanesulfonic acid, 3-mercaptopropanesulfonic acid, derivatives of the above-listed sulfonic acids, and salts of the above-listed sulfonic acids.

9. The electroless plating method as set forth in claim 6, wherein the metal portion is made of a first metal, and metallic salt of a second metal different from the first metal is included in the electroless plating solution.

10. The electroless plating method as set forth in claim 9, wherein the first metal is a metal selected from the group consisting of copper (Cu), cobalt (Co), nickel (Ni), ruthenium (Ru), palladium (Pd), silver (Ag), iridium (Ir), and alloys thereof.

11. The electroless plating method as set forth in claim 9, wherein the second metal is a metal selected from the group consisting of cobalt (Co), nickel (Ni), copper (Cu), ruthenium (Ru), silver (Ag), and alloys thereof.

12. The electroless plating method as set forth in claim 6, wherein the substrate has an interlayer insulation film in which at least one of a recession and an opening is formed, and the metal portion is buried in at least one of the recession and the opening.

13. An electroless plating pre-treatment solution being an aqueous solution comprising at least one selected from the group consisting of 3-[(amino-iminomethyl)-thio]-1-propanesulfonic acid, 2-aminoethanesulfonic acid, bis(3-sulfopropyl)disulfide, 3-(2-benzthiazolylthio)-1-propanesulfonic acid, and 3-mercaptopropanesulfonic acid, derivatives of the above-listed sulfonic acids, and salts of the above-listed sulfonic acids.

14. The electroless plating pre-treatment solution as set forth in claim 13, wherein said at least one activation accelerator is at least one selected from the group consisting of salts of 3-[(amino-iminomethyl)-thio]-1-propanesulfonic acid, salts of 2-aminoethanesulfonic acid, salts of bis(3-sulfopropyl)disulfide, salts of 3-(2-benzthiazolylthio)-1-propanesulfonic acid, and salts of 3-mercaptopropanesulfonic acid.

15. The electroless plating pre-treatment solution as set forth in claim 13, further comprising at least one selected from the group consisting of an inorganic acid, a salt of said inorganic acid, an organic acid other than sulfonic acid, and a salt of said organic acid.

16. The electroless plating pre-treatment solution as set forth in claim 15, comprising at least one of hydrochloric acid and sulfuric acid.

* * * * *